(12) United States Patent
Dietrich et al.

(10) Patent No.: US 11,990,307 B2
(45) Date of Patent: May 21, 2024

(54) ELECTRON GUN

(71) Applicant: Thales Deutschland GmbH Electron Devices, Ulm (DE)

(72) Inventors: Christof Dietrich, Niederstotzingen (DE); Norbert Festl, Neu-Ulm (DE); Harald Seidel, Burgrieden (DE)

(73) Assignee: Thales Deutschland GmbH Electron Devices, Ulm (DE)

( * ) Notice: Subject to any disclaimer, the term of this patent is extended or adjusted under 35 U.S.C. 154(b) by 504 days.

(21) Appl. No.: 17/277,760

(22) PCT Filed: Sep. 11, 2019

(86) PCT No.: PCT/EP2019/074183
§ 371 (c)(1),
(2) Date: Mar. 19, 2021

(87) PCT Pub. No.: WO2020/058053
PCT Pub. Date: Mar. 26, 2020

(65) Prior Publication Data
US 2021/0350995 A1 Nov. 11, 2021

(30) Foreign Application Priority Data

Sep. 20, 2018 (DE) .................... 10 2018 123 100.8

(51) Int. Cl.
*H01J 3/02* (2006.01)
*H01J 23/07* (2006.01)
*H01J 35/06* (2006.01)

(52) U.S. Cl.
CPC .............. *H01J 3/027* (2013.01); *H01J 23/07* (2013.01); *H01J 35/06* (2013.01)

(58) Field of Classification Search
CPC .. H01J 3/027; H01J 23/07; H01J 35/06; H01J 37/067; H01J 1/18; H01J 1/28; H01J 1/94;
(Continued)

(56) References Cited

U.S. PATENT DOCUMENTS 3,478,244 A 11/1969 Meyer et al.
3,610,988 A * 10/1971 Schmitz ................ H01J 29/487
313/414
(Continued)

FOREIGN PATENT DOCUMENTS

FR 2965971 B1 11/2012
GB 424690 A 2/1935

OTHER PUBLICATIONS

International Search Report in PCT/EP2019/074183, dated Jan. 30, 2020.

*Primary Examiner* — Courtney D Thomas
(74) *Attorney, Agent, or Firm* — Collard & Roe, P.C.

(57) ABSTRACT

An electron gun includes: a cathode, which has a cathode holder and a cathode body; and a Wehnelt cylinder. The cathode holder receives the cathode body and the Wehnelt cylinder is suitable for bundling free electrons, which can escape from the cathode body toward the Wehnelt cylinder, to form an electron beam. The Wehnelt cylinder is interlockingly arranged, at least in some parts along a first inner surface facing the cathode holder, on an outer surface of the cathode holder and at least partly extends around the cathode holder.

19 Claims, 5 Drawing Sheets

Figure 1:
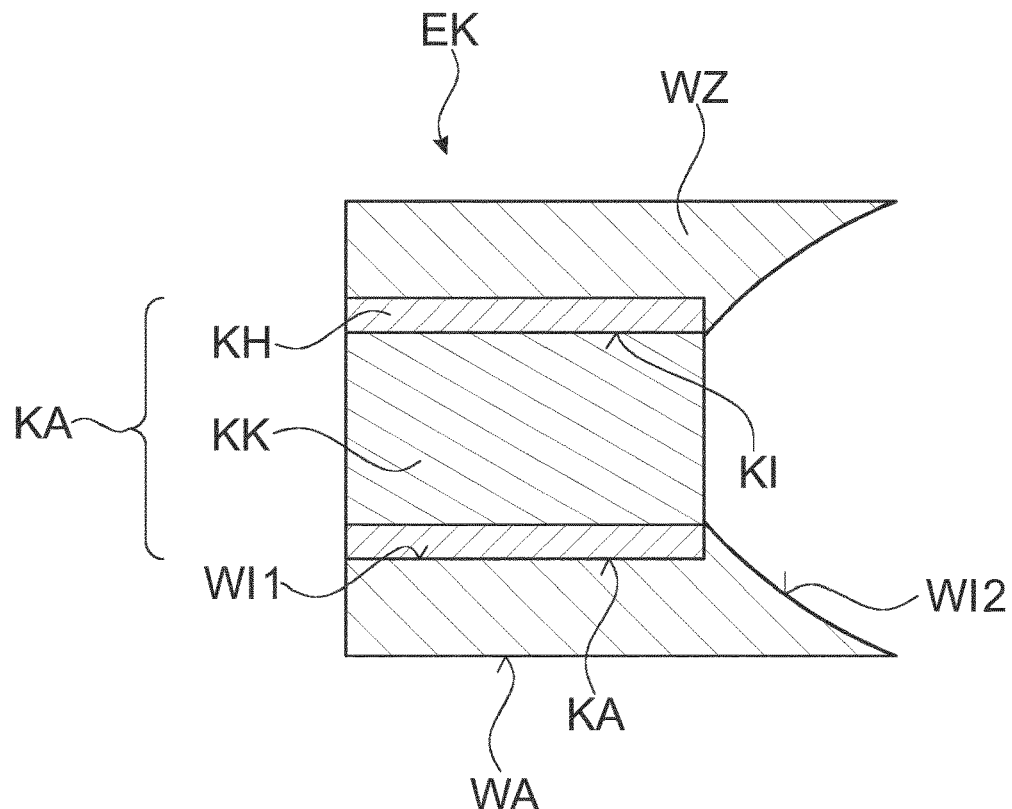

(58) Field of Classification Search
CPC .. H01J 3/14; H01J 23/04; H01J 23/083; H01J 25/36; H01J 25/42; H01J 35/066; H01J 1/26
See application file for complete search history.

(56) References Cited

U.S. PATENT DOCUMENTS

| | | | |
|---|---|---|---|
| 4,644,219 A * | 2/1987 | Huebner | H01J 23/04 |
| | | | 313/446 |
| 4,900,982 A | 2/1990 | Kolpin | |
| 6,115,453 A * | 9/2000 | Hell | H01J 35/064 |
| | | | 378/146 |
| 2006/0091776 A1 | 5/2006 | Munehiro et al. | |
| 2008/0211376 A1 | 9/2008 | Yasuda et al. | |

* cited by examiner

ELECTRON GUN

CROSS REFERENCE TO RELATED APPLICATIONS

This application is the National Stage of PCT/EP2019/074183 filed on Sep. 11, 2019, which claims priority under 35 U.S.C. § 119 of German Application No. 10 2018 123 100.8 filed on Sep. 20, 2018, the disclosure of which is incorporated by reference. The international application under PCT article 21(2) was not published in English.

The invention relates to an electron gun, especially for traveling-wave tubes.

An electron gun is a component by means of which thermal electrons are first generated, then accelerated and focused on a target in a beam path. In the process, the electrons are released from a cathode, to which energy is supplied in the form of heat. The electrons released from the cathode are then subjected to a first focusing by a Wehnelt cylinder, in which the electrons are aligned with an anode formed mostly as a pinhole aperture. Between the anode, which has a positive electrical potential relative to the cathode, and the cathode, the electrons are accelerated. Known designs for electron guns, besides a large number of other designs, are the Rogowski electron gun or the Pierce electron gun, for example.

The focusing of electrons to a continuous electron beam takes place by a Wehnelt cylinder. Focusing takes place by generating a potential difference between the Wehnelt cylinder, which is usually concavely shaped, and the anode, so that the electrons are refracted toward a common focus along this potential, which is usually idealized as a half-shell shape.

For the construction of electron guns, particular importance is attached to the focusing of the electron beam. Constructive parameters, by means of which the focusing and the divergence of an electron beam may be influenced, are the shape of the Wehnelt cylinder, the shape of the anode, the shape of the cathode, the respective potential differences between the components and the distances—which to some extent depend on the type of construction—between the components.

From US 2006/0091776 A1, an electron gun is known in which a disk-shaped cathode is disposed inside a hood-like retainer on a heating element, and a Wehnelt cylinder is disposed around the heating element and the cathode, wherein the Wehnelt cylinder and the cathode are spaced apart as well as thermally and electrically insulated from one another.

FR 2 965 971 B1 proposes a support structure for improvement of the alignment of electron guns, in which a Wehnelt cylinder having a cathode disposed therein in insulated manner is disposed by means of a series of insulating elements opposite a common support housing, wherein the support housing is simultaneously formed as the anode.

An electron gun arrangement in which a Wehnelt cylinder as well as a cathode and a support structure can be aligned relative to one another by means of set screws is known from U.S. Pat. No. 4,900,982. In this case, the Wehnelt cylinder, the cathode and the support structure are insulated from one another.

An arrangement in which the electrons are expelled from the cathode by means of a negatively charged electrode is known from US 2008/0211376 A1. The Wehnelt cylinder in that publication interacts with the cathode in such a way that a negative potential of the Wehnelt cylinder guides the electrons inside the cathode in such a way that they emerge from the cathode along a preferred axis.

An exchangeable cathode is shown in U.S. Pat. No. 3,478,244, wherein the cathode is disposed in insulated manner inside a housing and the Wehnelt cylinder is disposed on the housing in a manner insulated from it.

Especially for traveling wave tubes, which are frequently used in astronautics, particular importance is attached to the focusing of the electron beam and thus to the mutual alignment of the components of an electron gun as well as to the component strength under load. With respect to the complexity of the manufacture of an electron gun as well as the manufacture of a tube having an electron gun, it is desirable to keep the number of components as small as possible as well as to keep the alignment of the components relative to one another as simple as possible.

It is therefore the task of this invention to specify an improved electron gun.

This task is accomplished by the independent claim 1. Further advantageous configurations of the invention are respectively subject matter of the dependent claims. These may be combined with one another in technologically practical ways. The description, especially in conjunction with the drawing, additionally characterizes and specifies the invention.

According to the invention, an electron gun is specified that comprises a cathode having not only a cathode holder and a cathode body but also a Wehnelt cylinder, wherein the cathode holder receives the cathode body and the Wehnelt cylinder is suitable for bundling free electrons, which are able to emerge from the cathode body in the direction of the Wehnelt cylinder, as an electron beam, and the Wehnelt cylinder is disposed, at least in portions along a first inner face turned toward the cathode holder, interlockingly on an outer face of the cathode holder and at least partly surrounds the cathode holder.

Accordingly, an electron gun is specified in which the cathode holder, as the central component, is connected with the cathode body and also with the Wehnelt cylinder, wherein these components are in direct contact. In this situation, the Wehnelt cylinder has substantially hollow cylindrical shape and in its interior it interlockingly receives the cathode holder, which may have the shape of either a circular disk or cylinder. The cathode holder in turn receives, in its interior, which may likewise have the shape of a hollow cylinder, the cylindrical cathode body.

Besides a hollow cylindrical configuration of Wehnelt cylinder and cathode holder or a cylindrical configuration of the cathode body, frustoconical-shaped configurations are also conceivable. Thus individual components may be inserted only in one direction and also removed only in one direction. A particularly advantageous construction would be one in which the cathode body is frustoconically shaped, the cathode holder is formed in such a way relative to its inner face that it interacts interlockingly with the frustoconically shaped cooling element. Likewise, the Wehnelt cylinder may be frustoconically shaped on its inner face, so that a frustoconical structure of the cathode holder is able to engage in this inner face of the Wehnelt cylinder. In such a configuration, the cathode body as well as the cathode holder could escape only in one direction.

A particularly advantageous construction would also be one in which the cathode body is conically constructed and engages in a corresponding inner face of the cathode holder. The cathode body may then be introduced into the cathode holder from the direction in which thermal electrons are later discharged. If then the Wehnelt cylinder is additionally constructed such that a region projecting in the direction of the central axis of the components and covering the cathode holder also projects at least partly beyond the cathode body, the cathode body is made captive and cannot fall out in any direction, for example due to vibrations.

Since the cathode holder, the cathode body and the Wehnelt cylinder engage interlockingly in one another, these components are aligned unchangeably with one another with respect to their central axis. Accordingly, as far as the size and shape of the individual components are concerned, subsequent focusing of an electron beam can already be taken into consideration for manufacturing. Accordingly, the components of the electron gun according to the invention are already shaped in such a way that focusing of the electron beam may be accomplished simply and without further machining steps.

Compared with the prior art, further components for adjusting a defined distance between, for example, the Wehnelt cylinder and the cathode holder or between the cathode holder and the cathode body, are not needed in the electron gun according to the invention.

The Wehnelt cylinder is equipped with an inner face, which is turned toward the electrons emerging from the cathode body and on which potential surfaces are formed that bundle and focus the electrons. For this purpose, the region of the Wehnelt cylinder turned toward the beam axis of the electrons is typically formed in a manner tapering conically toward the cathode body. In the region turned toward the beam axis, the cross section of the Wehnelt cylinder may therefore be approximately trapezoidal, semicircular or paraboloid.

According to one embodiment of the invention, the Wehnelt cylinder is connected in electrically conductive manner with the outer face of the cathode holder at least in portions along the first inner face, and the cathode holder and the Wehnelt cylinder have an equal electrical potential.

Compared with the known solutions and constructions for electron guns, therefore, no electrical insulator is introduced between the Wehnelt cylinder and the cathode holder. Thus the Wehnelt cylinder and cathode holder have the same electrical potential. This electrical potential is usually slightly negative relative to the cathode body, and so the emergence of electrons from the cathode body is favored.

In a further related configuration, a thermal insulator may nevertheless be introduced between the Wehnelt cylinder and the cathode holder. Thus heat from the cathode body can be transferred to only a limited extent to the Wehnelt cylinder. The cathode body is heated during operation of the electron gun, and so measures such as this are necessary for control of the heat flow.

In this connection, it will be understood by thermal insulation that either a material is introduced or a constructive precaution is taken by means of which the corresponding region can be actively cooled. The material is to be selected such that it inhibits at least the phononic heat transport. For active cooling, slots may be considered, along which a cooling fluid such as air is able to flow. As materials that inhibit the thermal heat flow or at least the phononic part of the heat flow, compounds from the tellurides group may be considered. For example, bismuth telluride inhibits the heat transport by means of phonons, but it permits the movement of electrons, so that a potential equilibrium may be established.

According to a further embodiment of the invention, an electrical insulator is disposed between the cathode holder and the cathode body, and the cathode holder and the cathode body have an unequal electrical potential.

By this electrical insulator, it is ensured that, during operation of the electron gun, an electric field develops along the inner faces of the cathode holder turned toward the cathode body and is aligned such that electrons inside the cathode body are forced in the direction of its central axis. This has the consequence that the number of electrons per unit time that emerge from the cathode body in the region of the Wehnelt cylinder is increased. The insulator causes a potential separation between cathode body and cathode holder. Since, according to the invention, the Wehnelt cylinder is directly connected with the cathode holder, the insulator between cathode body and cathode holder therefore also separates the potential of Wehnelt cylinder and cathode body.

Instead of a purely electrical insulation between cathode body and cathode holder, an electrical insulation in conjunction with a thermal insulation could also be provided, so that the heat flow between cathode body and cathode holder is reduced. However, instead of an electrical insulator, it would also be possible to use exclusively a thermal insulator, so that the heat flow between cathode body and cathode holder is suppressed as completely as possible. Due to the thermal separation of cathode body and cathode holder, the Wehnelt cylinder is also less intensively heated, and so no or only few thermal electrons are emitted starting from the Wehnelt cylinder. For this purpose, it may also be practical to introduce, between the cathode holder and the Wehnelt cylinder, a thermal insulation which, for example, is disposed circumferentially around the cathode holder.

According to a further embodiment of the invention, the cathode body is connected, at least in portions, in electrically conductive manner with an inner face of the cathode holder and the cathode holder and the cathode body have the same electrical potential.

In this embodiment, therefore, with reference to one of the foregoing embodiments, cathode body, the cathode holder and the Wehnelt cylinder have the same electrical potential. Compared with the prior art, therefore, an electrical insulation that causes the Wehnelt cylinder to have a different potential, usually more negative, than the cathode, is not necessary and therefore not provided. Regardless of this, however, a thermal insulation may be provided between the Wehnelt cylinder and the cathode holder and/or between the cathode holder and the cathode body, so that no heat flow takes place from the cathode body, which is usually heated by an external energy source, toward the cathode holder, and no heat flow takes place from the cathode holder toward the Wehnelt cylinder. Materials that offer a good electrical conductivity but also a good thermal insulation include bismuth telluride or lead telluride among others. Instead of insulation based on material properties, it would also be possible to provide an active cooling, for example by contacting with a heat sink.

According to a further embodiment of the invention, the electron gun is equipped at least in regions with a non-emitting coating, wherein this non-emitting coating has a greater work function for the emission of electrons than does the cathode body.

Thermal electrons may escape from a solid-state composite if sufficiently large energy in the form of heat has been supplied to them. This is desired in a cathode body of an electron gun. In other regions, however, free electrons emerging from the metal composite are usually undesirable. In order to avoid these parasitic interference electrons, as they are known, the corresponding region from which escape is undesirable may be cooled. By means of cooling, the material present in the region is kept below that temperature at which electrons are emitted. Alternatively, however, a material having a high work function may be also applied on the regions from which escape of thermal electrons is undesirable, and in this way may inhibit the escape of thermal electrons.

Since, according to one embodiment of the invention, the cathode holder, the cathode body and the Wehnelt cylinder may be in thermal equilibrium and thus, for example, the Wehnelt cylinder could have approximately the same temperature as the cathode body, it is prevented by an appropriate coating of the surfaces that electrons are released from the coated region of the Wehnelt cylinder.

According to one embodiment of the invention, the Wehnelt cylinder is equipped with the non-emitting coating on a second inner face turned toward the electron beam.

This second inner face, which usually has concave shape, is situated, in the assembled condition of the electron gun, on a side of the electron gun turned toward an anode. Due to the coating of this second inner face of the Wehnelt cylinder with a non-emitting material it is prevented that electrons starting from the Wehnelt cylinder are discharged in the region of space between Wehnelt cylinder and the anode.

On the whole, therefore, it is possible to construct the Wehnelt cylinder and the cathode as components in contact and connected in thermally and/or electrically conductive manner and to prevent, by a non-emitting coating, the escape of electrons from regions where this is undesirable. By non-emitting within the meaning of this Application, it will be understood that the material-dependent and temperature-dependent work function for electrons is greater for the material of which the non-emitting coating consists than for the material of the cathode. In general, a low work function is intended for the cathode body as is a high work function for the other components of the electron gun.

Accordingly, therefore, regardless of thermal and electrical transfers between cathode and Wehnelt cylinder, the escape of thermal electrons from the Wehnelt cylinder is to be reduced or prevented by applying a non-emitting coating on parts of the Wehnelt cylinder.

In general, this coating could be provided on further components of the electron gun or further components of a tube in which the electron gun is used as the electron source. Thus, for example, the collector of a traveling wave tube could be provided at least in regions with the non-emitting coating.

According to one embodiment of the invention, the non-emitting coating comprises hafnium as an ingredient.

Assuming the normal operating parameters of an electron gun, hafnium has a high work function for electrons. A hafnium-containing coating or a hafnium-containing alloy therefore increases the work function in the coated regions, and so few electrons or no electrons are released in these regions.

According to a further embodiment of the invention, the Wehnelt cylinder is made in two parts, wherein an inner Wehnelt cylinder is surrounded by a hollow cylindrical outer Wehnelt cylinder.

Advantageously, the outer Wehnelt cylinder may be used as a radiation shield to reduce heat radiation of the cathode.

According to a further embodiment of the invention, the Wehnelt cylinder and the cathode holder are formed in one piece.

This one-piece construction of Wehnelt cylinder and cathode holder on the one hand reduces the complexity, because fewer components are necessary, and on the other hand the manufacture of an electron gun becomes particularly simple. Thus the combined component of Wehnelt cylinder and cathode holder represents a substantially radially symmetrical component that could be manufactured simply and inexpensively by means of a CNC milling process. Ideally, this combined component, just as in the case of individual components, is manufactured from a material that has a high work function for electrons and is heat-resistant.

According to one embodiment of the invention, the cathode holder is made in hollow cylindrical manner, wherein the inside diameter is dimensioned such that the cathode body can be received interlockingly in the cathode holder.

Due to the interlocking accommodation of cathode body in the cathode holder, no additional parts are necessary, for example for connection or for reduction of vibrations. The cathode body is frequently constructed as a porous member and could have a support in which the material is inserted in disk-like manner. In this case, the support would then engage in the cathode holder. In the construction with an insulation introduced between the cathode holder and the cathode body, this is likewise constructed in hollow cylindrical manner to correspond to the shape of the cathode holder, and it joins the cathode holder and cathode body frictionally.

According to a further embodiment of the invention, the cathode holder has on its outer face a shoulder formed at least in portions and extending radially relative to the circumference of the cathode holder, wherein the Wehnelt cylinder rests on this shoulder.

Accordingly, for simple and secure connection of the Wehnelt cylinder and cathode holder, a shoulder is provided on which the Wehnelt cylinder rests in the assembled condition. From the other side of the electron gun outward, i.e. opposite the Wehnelt cylinder, a support fixture of a tube in which the electron gun is inserted may correspond with the shoulder. Thus the electron gun may be introduced simply into a tube and, via a support fixture of the tube, is held therein. Starting from the shoulder, a further support fixture, by means of which one or more anodes, for example, are held, may extend in the direction of the beam axis.

According to a further embodiment of the invention, the cathode body is made from a porous material, which is suitable for emitting free electrons during the supply of energy in the form of heat.

The work function depends mainly on material-specific properties. Since the escape of thermal electrons from the cathode is desired, the cathode is manufactured from a material having low work function. Since the thermal electron current is proportional to the area from which the electrons are emitted, the material is constructed in porous condition, i.e. with large surface area.

According to a further embodiment of the invention, the electron gun comprises a heating device, which is suitable for supplying the cathode body with energy in the form of heat, wherein the heating device is disposed on a side of the cathode body opposite the Wehnelt cylinder and optionally is disposed inside the cathode holder.

Accordingly, a heating element, from which heat can be delivered to the cathode body, is provided inside the cathode holder, so that the thermal electrons are able to overcome the work function of the cathode body. The heating device is constructed in a manner insulated at least electrically from the cathode body, so that the current flow heating the heating element does not also heat the cathode holder or even the Wehnelt cylinder. Logically, the heating device is additionally constructed in thermally insulating manner relative to the cathode holder, in which it may be disposed. The heating device may also be formed as a rod, which engages in at least partly electrically insulated manner in the cathode body. For simple assembly of an electron gun, the heating device may be disposed inside a cylindrical body, which corresponds with the inner face of the cathode holder. It is also possible for the heating element to be associated with the tube in which the electron gun is inserted and, for example, to be disposed on a support fixture for the electron gun. Accordingly, the electron gun would be held and aligned in the tube via the heating device among other means.

According to a further embodiment of the invention, the electron gun comprises an anode disposed along its beam axis, wherein the anode has a positive electrical potential relative to the cathode and is electrically insulated relative to the Wehnelt cylinder, the cathode body and the cathode.

Thus it is ensured, regardless of which potential prevails between cathode body, cathode holder and Wehnelt cylinder, that the cathode has a negative electronic potential relative to the anode. Thus electrons expelled from the cathode body by heating are accelerated in the direction of the anode. Ideally, the anode is convex and its shape is made to correspond with the Wehnelt cylinder, so that electrons on their way from cathode to anode along the potential surfaces are focused on a hole formed in the anode and pass through the hole. In order to ensure vibration-proof alignment between cathode and anode, the anode may be disposed by means of an insulated or insulating support on the Wehnelt cylinder or, for example, on the shoulder of the cathode body. Instead of one anode, several anodes disposed in series along the beam axis may also be used.

According to a further embodiment of the invention, the anode can be aligned relative to the Wehnelt cylinder, the cathode and the beam axis via an adjusting means.

Such an adjusting means could be, for example, one or more screws, which extend radially relative to the beam axis and via which the anodes are connected with an insulating or insulated support structure. By means of the screws, the anode could be aligned with its central axis, i.e. together with its hole formed at the center, exactly on the electron beam.

According to a further embodiment of the invention, the components can be aligned relative to one another in such a way that the electron beam is focused on a target.

In order to ensure an assembly of a tube that is as simple as possible and with minimum errors, the electron gun may already be focused before installation in a tube. This has on the one hand the advantage that a focusing can still be accomplished simply outside the tube, because the individual components can still be accessed, and on the other hand that the complexity during assembly of a tube is reduced. For traveling wave tubes, for example, the focusing of the electron beam represents one of the most laborious steps of assembly of the tube. In the case of electron guns already focused beforehand, the assembly of traveling wave tubes becomes significantly easier.

Beyond this, the use of an electron gun having the above-mentioned features is specified as an electron source inside a tube.

Such a tube could be, for example, an x-ray tube.

In particular, the use of an electron gun according to one of the above-mentioned embodiments having a traveling wave tube is claimed. A traveling wave tube typically comprises a delay line, a collector and an electron source, which according to the claims is constructed as one of the above-mentioned electron guns.

Corresponding to the foregoing embodiments, it is possible according to the invention to create an electron gun in such a way that the Wehnelt cylinder is neither thermally nor electrically insulated relative to the cathode, but also no electrons are able to escape from it, because it is equipped with a non-emitting coating, at least in certain regions. Thus a particularly simple design of an electron gun is possible, without the need to provide further insulators, spacers or cooling elements.

For connection of the individual components of the electron gun, these may be connected, for example, with a thermally insulating adhesive. Alternatively, however, the components could also be screwed together.

Figure 2:
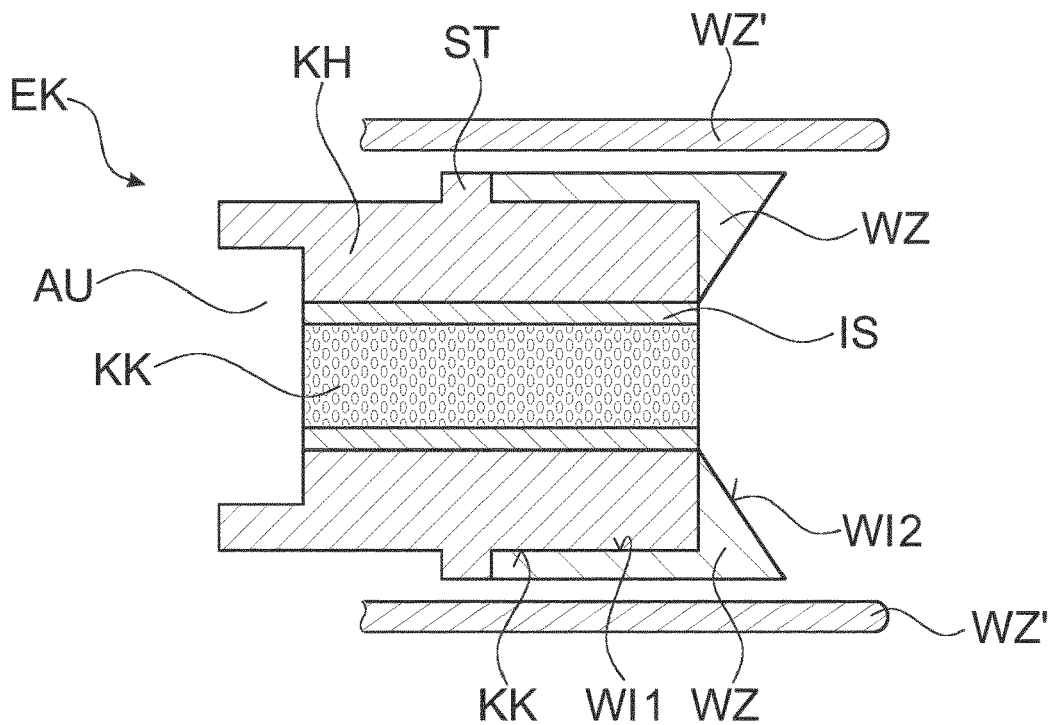
Figure 3:
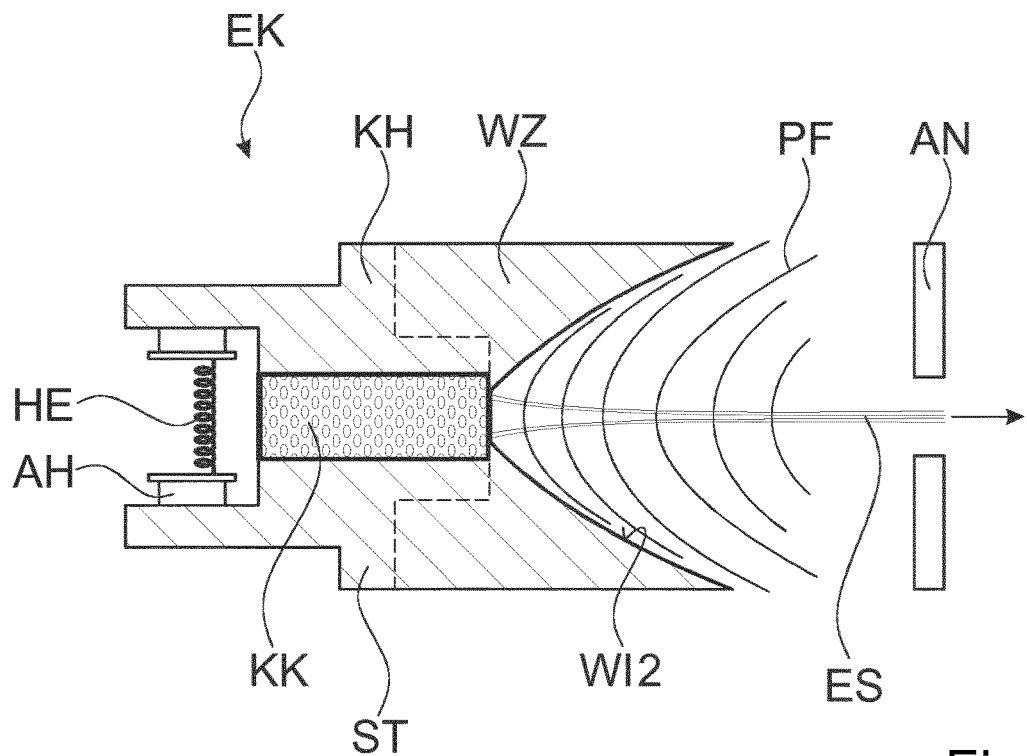
Figure 4:
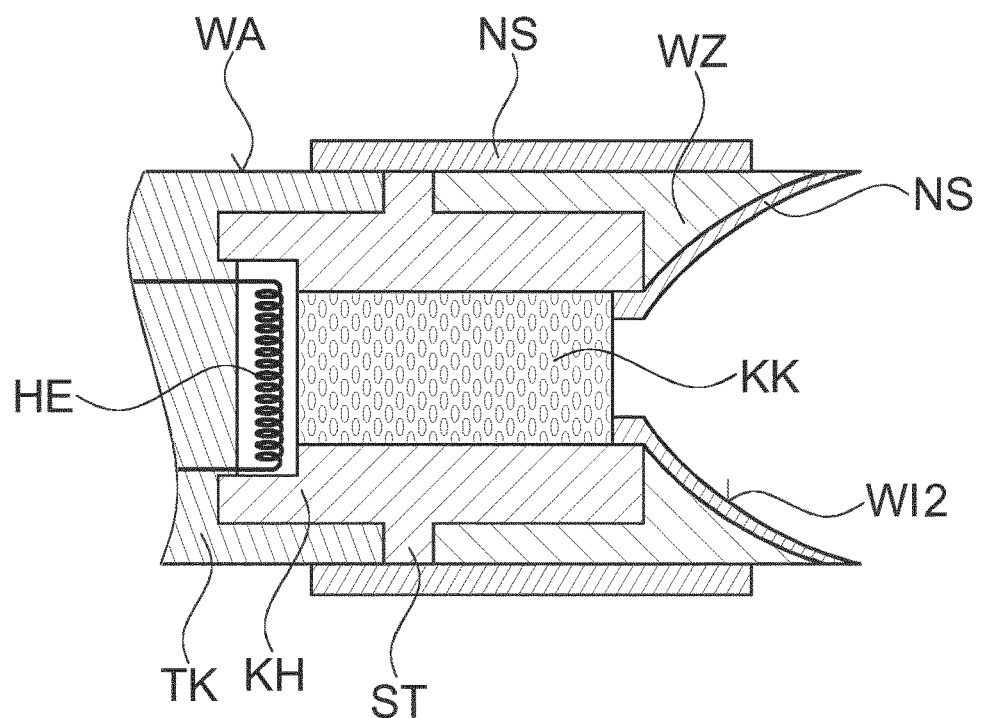
Figure 5A:
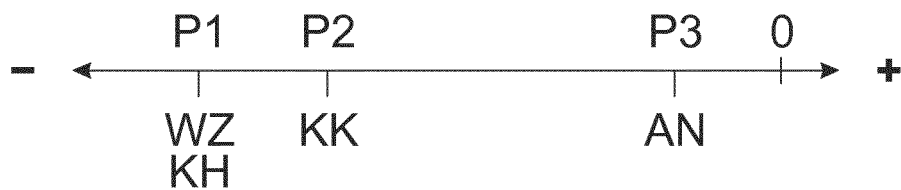
Figure 5B:
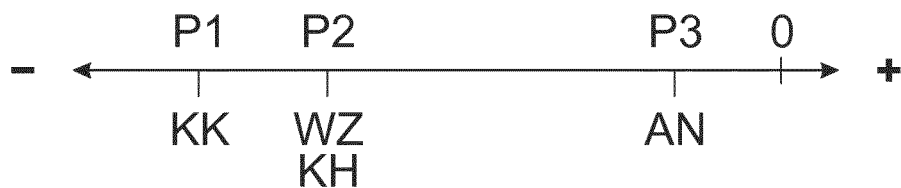
Figure 5C:
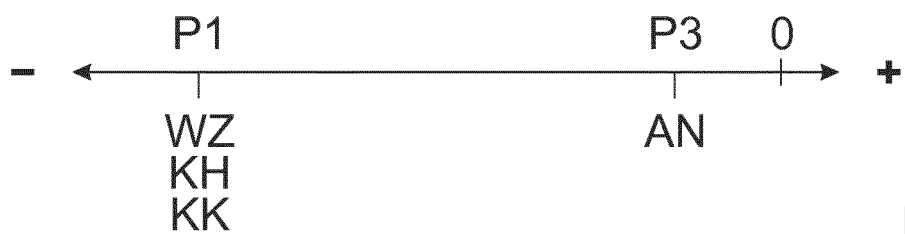
Figure 6:
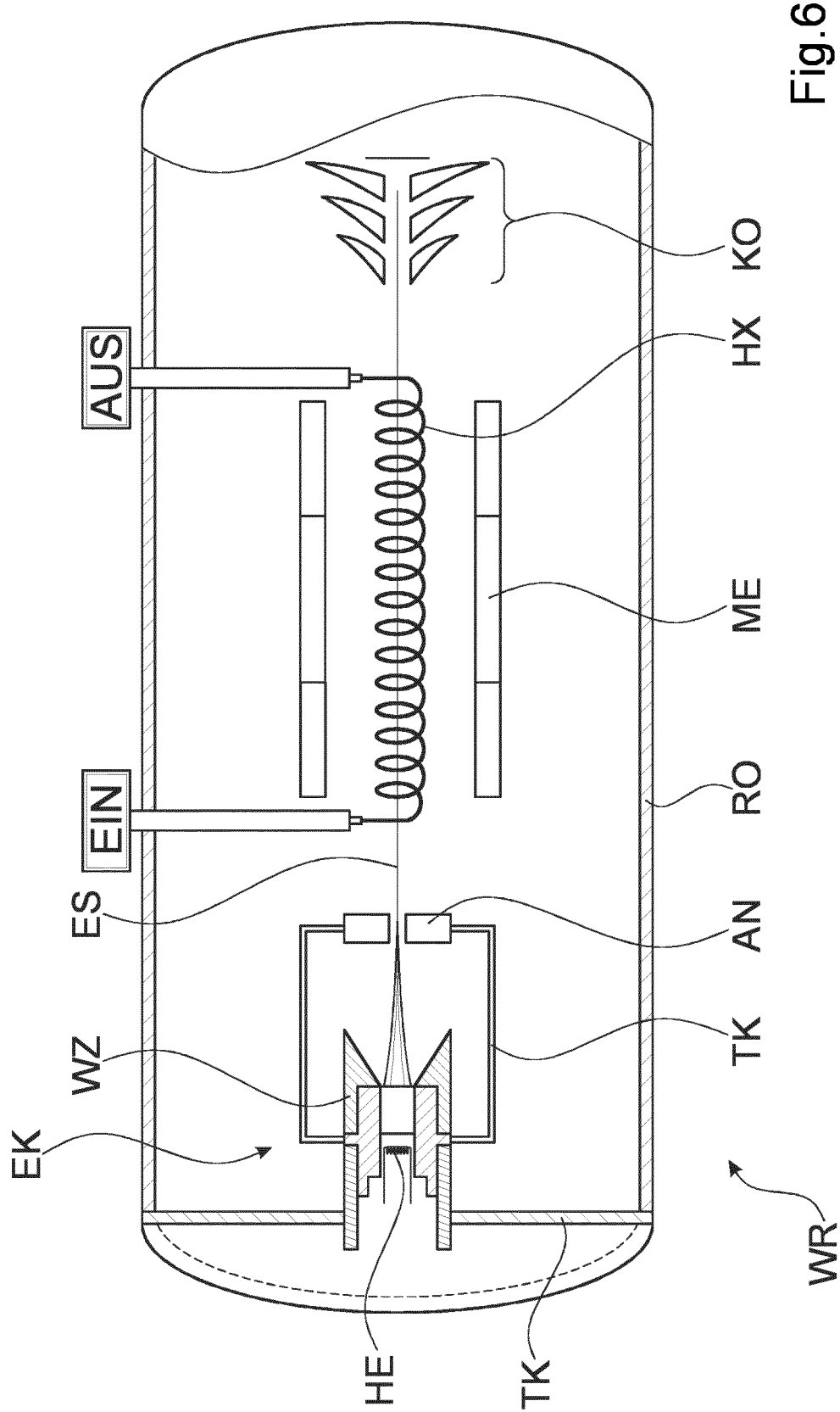
Figure 7:
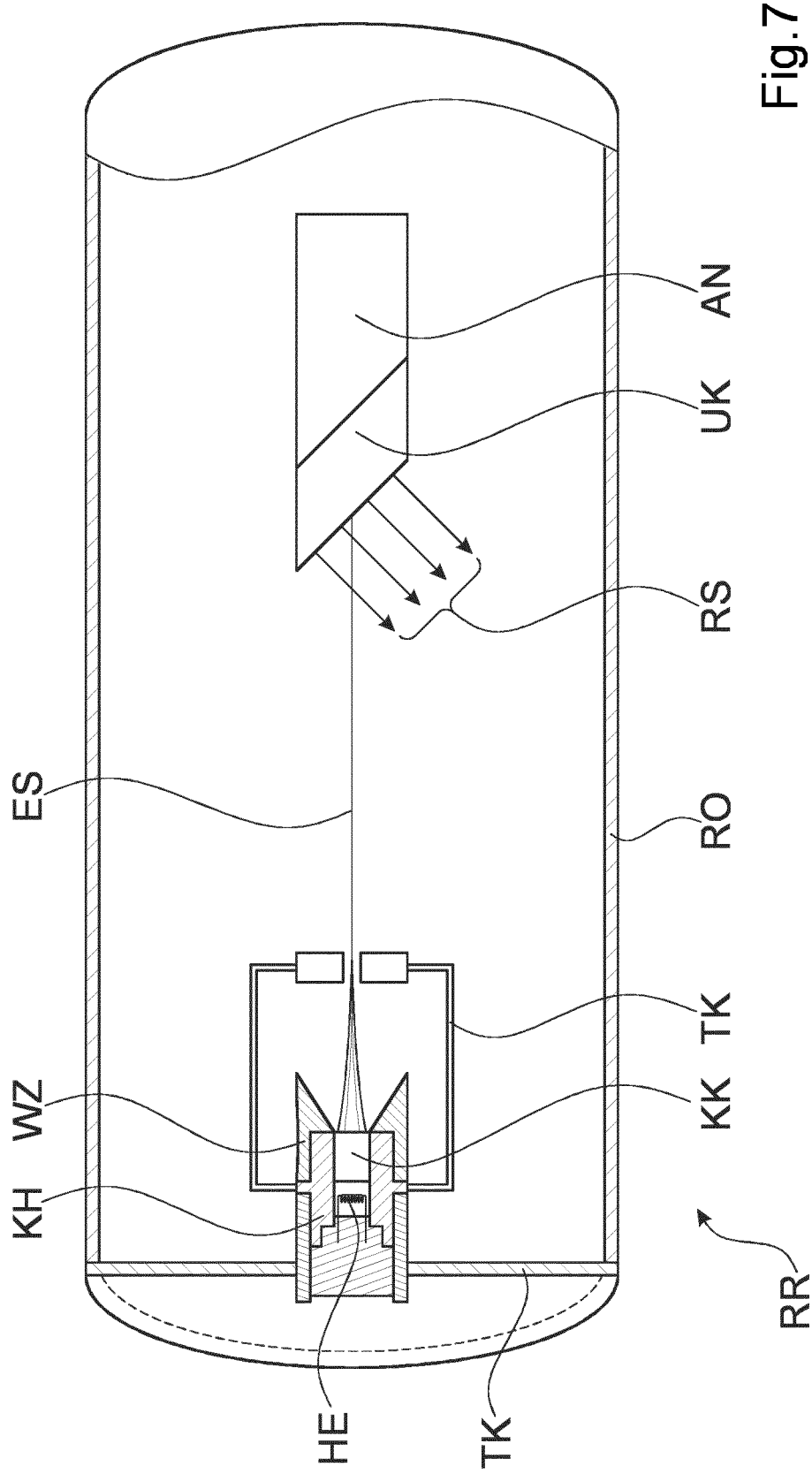

Some exemplary embodiments will be explained in more detail hereinafter on the basis of the drawing, wherein:

FIG. 1 shows an electron gun according to the invention in a cross-sectional diagram, FIG. 2 shows an embodiment of the electron gun according to the invention in a cross-sectional view, FIG. 3 shows a further embodiment of the electron gun according to the invention in a cross-sectional view, FIG. 4 shows a further embodiment of the electron gun according to the invention in a cross-sectional view, FIG. 5 shows a diagram of the individual electrical potentials between individual components of the electron gun according to the invention, FIG. 6 shows a traveling wave tube with an electron gun according to the invention in a cross-sectional view, and FIG. 7 shows an x-ray tube with an electron gun according to the invention in a cross-sectional view.

In the figures, like or functionally equivalent components are denoted by like reference numerals.

In FIG. 1, an electron gun EK is shown that has a Wehnelt cylinder WZ and a cathode KA having a cathode holder KH and a cathode body KK. The cathode holder KH receives, along its inner face KI, the cathode body KK. In turn, the Wehnelt cylinder WZ receives, along its first inner face WI1, the cathode holder KH along its outer face KA. During operation of the electron gun EK, thermal electrons from the cathode body KK are discharged into the region surrounded by the second inner face WI2 of the Wehnelt cylinder WZ after the supply of energy in the form of heat. These electrons are then focused and accelerated along an electric field extending from the second inner face WI2 of the Wehnelt cylinder WZ in the direction of an anode, not illustrated in FIG. 1. In contrast to known arrangements, the Wehnelt cylinder WZ is in contact with the cathode KA in a manner corresponding to the invention. In FIG. 2, an embodiment of the electron gun is shown in which the Wehnelt cylinder WZ is indeed in direct contact with the cathode holder KH, but the cathode holder KH is separated from the cathode body KK by means of an insulation IS. The insulation IS shown there separates the cathode body KK thermally and/or electrically from the cathode holder KH. In the case of an electrical separation by means of the insulator IS, the potential of Wehnelt cylinder WZ and cathode holder KH relative to the cathode body KK could be positive or negative, wherein a negative potential of the Wehnelt cylinder WZ is usually preferred, in which the Wehnelt cylinder WZ therefore has a negative potential relative to the cathode body KK.

The electron gun EK shown in FIG. 2 additionally comprises a shoulder ST, on which the Wehnelt cylinder WZ is braced. On its side turned away from the Wehnelt cylinder WZ, the cathode holder KH is additionally equipped with an internally positioned recess AU, in which a support structure or a heating element, for example, is able to engage during use of the electron gun EK inside a tube arrangement.

Furthermore, the front side of the Wehnelt cylinder WZ shown in FIG. 2 is inclined in the direction of the anode much more strongly away from a direction of an electron beam, so that the Wehnelt cylinder WZ is shorter along this direction and thus has less mass. In order now to form the potential surfaces corresponding to the embodiment shown in FIG. 1 in the manner of half shells (in this regard see also below under FIG. 3), a further outer Wehnelt cylinder WZ' is provided, which surrounds the inner Wehnelt cylinder WZ and the cathode holder KH in the form of a hollow cylinder along the direction of the electron beam. The outer Wehnelt cylinder WZ' also functions as shielding of the heat radiation discharged by the cathode. Instead of inner Wehnelt cylinder WZ and outer Wehnelt cylinder WZ', a two-piece Wehnelt cylinder would also be conceivable here.

In FIG. 3, a heating element HE is shown, from which energy in the form of heat may be delivered to the cathode body KK. The heating element HE is disposed inside the cathode holder KH and is separated thermally and electrically from it via a spacer AH. Furthermore, the electron gun shown in FIG. 3 is formed in such a way that the Wehnelt cylinder WZ and the cathode holder KH are provided as a common component made from one piece. The boundaries between the Wehnelt cylinder WZ and the cathode holder KH, as would be present in the construction as separate components, are shown in FIG. 3 by a dashed line. The electron gun in FIG. 3 has a shoulder ST, on which the electron gun may be held inside a tube.

On a side of the electron gun EK disposed opposite the heating element HE, an anode AN is disposed. Potential surfaces PF of extensively half-shell shape extend between the anode AN and the concavely formed Wehnelt cylinder WZ. Along these potential surfaces PF, thermal electrons released from the cathode body KK are focused in the direction of a pinhole aperture provided in the anode AN. The anode AN itself has a positive electrical potential relative to the cathode KA, and so the free electrons emerging from the cathode body KK are accelerated toward the anode AN.

Since the Wehnelt cylinder WZ and the cathode holder KH are made in one piece or are not thermally insulated from one another, and since the cathode body KK is constructed in neither thermally nor electrically insulating manner relative to the cathode holder KH, electrons could also be extracted from the Wehnelt cylinder WZ, for example, in the electron gun EK shown in FIG. 3. In order to prevent this escape of thermal electrons, a non-emitting coating NS may be provided, as shown in FIG. 4. Alternatively, for inhibition of the heat flow from the cathode body to the cathode holder, it would also be possible, in the one-piece construction of Wehnelt cylinder WZ and cathode holder KH shown in FIG. 3, to introduce a thermal insulation as shown in FIG. 2 between the cathode body KK and the cathode holder.

The non-emitting coating NS shown in FIG. 4 is disposed, for example, along the second inner face WI2 of the Wehnelt cylinder WZ. Due to this non-emitting coating NS, no thermal electrons known as interference emission are released from this region. Furthermore, a non-emitting coating NS is likewise provided on the outer face WA of the Wehnelt cylinder WZ. The heating device HE shown in FIG. 4 is disposed in a support structure TK of a tube, not shown. The support structure TK, which is able to receive the electron gun EK, for example, in a tube arrangement, rests on the shoulder ST, as does also the Wehnelt cylinder. The non-emitting coating NS may be provided at any desired place or in any desired region of the electron gun EK, wherein a coating is practical in the region of the electron beam in particular. The coating may be applied by vapor deposition, for example.

FIG. 5 shows different potential configurations between the Wehnelt cylinder WZ, the cathode holder KH, the cathode body KK and the anode AN.

Therein, FIG. 5A shows a configuration in which the cathode body KK has a low negative electrical potential P2 relative to the Wehnelt cylinder WZ and the cathode holder KH. The higher negative potential P1 is present at the Wehnelt cylinder WZ and the cathode holder KH. The anode AN has an electrical potential P3 that is negative relative to the zero point 0 but is more positive in relation to the other potentials. The potential distribution shown in FIG. 5A is therefore of advantage especially because electrons are forced into the inner region of the cathode body KK due to the more negative potential of cathode holder KH and Wehnelt cylinder WZ, so that the electron density rises in this region and the work function is reduced, or the number of electrons released per unit time increases. The inverse of this situation is shown in FIG. 5B.

The potential distribution shown in FIG. 5B once again provides a more positive potential P3 for the anode AN, but the lower negative potential P2 is present at the Wehnelt cylinder WZ and the cathode holder KH. In contrast, the higher negative electrical potential is present at the cathode body KK. This arrangement has as a consequence that the electrons are more concentrated inside the peripheral region of the cathode body KK turned toward the cathode holder KH. Thus, even on the side of the cathode body KK turned toward the anode AN, an emission takes place predominantly along this peripheral region.

FIG. 5C shows an embodiment in which the Wehnelt cylinder WZ, the cathode holder KH and the cathode body KK are not insulated from one another. There the Wehnelt cylinder WZ, the cathode holder KH and the cathode body KK all have the higher negative electrical potential P1. In FIG. 5C, the anode AN still has the more positive potential P3. Although all components other than the anode AN in FIG. 5C have the same higher negative electrical potential P1, these components could still be at least thermally insulated from one another. It is to be noted in FIG. 5 that the axis is not to scale, and only the polarity of an electrical potential and thus also the direction of an electric field between individual components may be inferred from it. The absolute magnitude of individual potential differences cannot be inferred from FIG. 5.

FIG. 6 shows a traveling wave tube arrangement WR, in which an electron gun EK according to the invention is connected via a support structure TK with the tube RO. The anode AN of the electron gun EK is likewise connected via a support structure TK. This support structure TK of the anode AN rests on the shoulder ST of the electron gun EK. The support structures TK, TK are respectively constructed in electrically insulating manner.

The course of the electron beam ES, starting from the electron gun EK, first involves a helically formed delay line HX, in which electrical signals are injected from an input EIN (IN) to an output AUS (OUT). Around the delay line HX, a magnetic focusing device ME is disposed, which forms the electron beam inside the delay line HX. The delay line HX is followed in the path of the electron beam ES by the collector KO, in which the electrons of the electron beam ES are captured. Since the electron gun EK with its anode AN, its Wehnelt cylinder WZ, its cathode holder KH and the cathode body KK as well as the heating element HE was already focused before the introduction into the tube RO, this step no longer had to be undertaken during assembly of the traveling wave tube WR. Thus the preparation of an already prefocused electron gun saves time in the manufacture of traveling wave tube arrangements WR.

FIG. 7 shows another tube, namely an x-ray tube. A preconfigured electron gun EK, the components of which were already matched to one other with respect to focusing of the electron beam, was also assembled in FIG. 7. The electron beam ES, which emerges from the electron gun EK, is guided to an anticathode UK having an anode AN situated behind it, wherein, upon impingement of the electrons of the electron beam ES on the anticathode UK, the electrons are braked so strongly that they emit x-rays RS in a direction predetermined by the anticathode.

In general, the electron gun as described in this Application may be used in all tubes that need an electron source in the form of an electron gun.

For reasons of clarity, neither electrical incoming or outgoing leads nor a corresponding power supply is shown in any of the figures.

The features in the foregoing and those specified in the claims as well as evident from the figures can advantageously be realized both individually and in various combinations. The invention is not limited to the described exemplary embodiments but can be modified in quite a few ways within the scope of the know-how of those skilled in the art.

The invention claimed is:

1. An electron gun (EK) comprising a cathode (KA) having not only a cathode holder (KH) and a cathode body (KK) but also a Wehnelt cylinder (WZ),
    wherein the cathode holder (KH) receives the cathode body (KK) and the Wehnelt cylinder (WZ) is suitable for bundling free electrons, which are able to emerge from the cathode body (KK) in the direction of the Wehnelt cylinder (WZ), as an electron beam (ES), and the Wehnelt cylinder (WZ) is disposed, at least in portions along a first inner face (WI1) turned toward the cathode holder (KH), interlockingly on an outer face (KA) of the cathode holder (KH) and at least partly surrounds the cathode holder (KH);
    wherein the cathode holder (KH) is made in hollow cylindrical manner; and
    wherein the inside diameter is dimensioned such that the cathode holder (KH) is configured to receive the cathode body (KK) interlockingly in the cathode holder (KH).

2. The electron gun according to claim 1, in which the Wehnelt cylinder (WZ) is connected in electrically conductive manner with the outer face (KA) of the cathode holder (KH) at least in portions along the first inner face (WI1), and the cathode holder (KH) and the Wehnelt cylinder (WZ) have an equal electrical potential.

3. The electron gun according to claim 1, in which an electrical insulator (IS) is disposed between the cathode holder (KH) and the cathode body (KK), and the cathode holder (KH) and the cathode body (KK) have an unequal electrical potential.

4. The electron gun according to claim 1, in which the cathode body (KK) is connected in electrically conductive manner with an inner face (KI) of the cathode holder at least in portions, and the cathode holder (KH) and the cathode body (KK) have an equal electrical potential.

5. The electron gun according to claim 1, in which the Wehnelt cylinder is made in two parts, wherein an inner Wehnelt cylinder (WZ) is surrounded by a hollow cylindrical outer Wehnelt cylinder (WZ').

6. The electron gun according to claim 1, which is equipped at least in regions with a non-emitting coating (NS), wherein the non-emitting coating (NS) has a greater work function for the emission of electrons than does the cathode body (KK).

7. The electron gun according to claim 6, in which the Wehnelt cylinder (WZ) is equipped with the non-emitting coating (NS) on a second inner face (WI2) turned toward the electron beam (ES).

8. The electron gun according to claim 6, in which the Wehnelt cylinder (WZ) is equipped with the non-emitting coating (NS) on an outer face (WA).

9. The electron gun according to claim 6, the non-emitting coating of which comprises hafnium as an ingredient.

10. The electron gun according to claim 1, in which the Wehnelt cylinder (WZ) and the cathode holder (KH) are made in one piece.

11. The electron gun according to claim 1, in which the cathode holder (KH) has on its outer face (KA) a shoulder (ST) formed at least in portions and extending radially relative to the circumference of the cathode holder (KH), wherein the Wehnelt cylinder (WZ) rests on this shoulder.

12. The electron gun according to claim 1, the cathode body (KK) of which is made from a porous material, which is suitable for emitting free electrons during the supply of energy in the form of heat.

13. The electron gun according to claim 1, which comprises a heating device (HE), which is suitable for supplying the cathode body (KK) with energy in the form of heat, wherein the heating device (HE) is disposed on a side of the cathode body (KK) opposite the Wehnelt cylinder (WZ).

14. The electron gun according to claim 13, the heating device (HE) of which is disposed inside the cathode holder (KH).

15. The electron gun according to claim 1, which comprises an anode (AN) disposed along the beam axis (SA), wherein the anode (AN) has a positive electrical potential relative to the cathode (KA) and is electrically insulated relative to the Wehnelt cylinder (WZ), the cathode body (KK) and the cathode (KA).

16. The electron gun according to claim 15, wherein the anode (AN) is configured to be aligned relative to the Wehnelt cylinder (WZ), the cathode (KA), and the beam axis (SA) via an adjusting means.

17. The electron gun according to claim 1, the components of which are configured to be aligned relative to one another in such a way that the electron beam (ES) is focused on a target.

18. An x-ray arrangement having the electron gun (EK) according to claim 1, in which the electron gun (EK) is disposed as the electron source inside the tube (RO).

19. A traveling wave tube (WR) having the electron gun (EK) according to claim 1, which comprises a delay line (HX) and a collector (KO), wherein the electron beam (ES) is guided during operation of the traveling wave tube (WR) by the delay device (HX) extending helically from the electron gun (EK) to the collector (KO) and the collector (KO) forms, for the electron beam (ES), the target in which the electrons are captured.

* * * * *